United States Patent
Krasnansky et al.

(10) Patent No.: US 7,046,069 B2
(45) Date of Patent: May 16, 2006

(54) METHOD TO REDUCE INDUCTIVE EFFECTS OF CURRENT VARIATIONS BY INTERNAL CLOCK PHASE SHIFTING

(75) Inventors: Keith Gerard Krasnansky, Germantown, MD (US); Ronald Drafz, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 29 days.

(21) Appl. No.: 10/894,148

(22) Filed: Jul. 19, 2004

(65) Prior Publication Data

US 2006/0012416 A1   Jan. 19, 2006

(51) Int. Cl.
    *H03K 17/16* (2006.01)
(52) U.S. Cl. ............................... 327/379; 327/384
(58) Field of Classification Search ............... 327/379, 327/380, 384, 392, 393, 396; 710/305
    See application file for complete search history.

(56) References Cited

U.S. PATENT DOCUMENTS 5,874,833 A * 2/1999 Perry et al. ................... 326/26

6,732,214 B1 * 5/2004 Cohen et al. ................. 710/305

* cited by examiner

*Primary Examiner*—Linh My Nguyen
(74) *Attorney, Agent, or Firm*—Abdul Zindani; Wade James Brady, III; Frederick J. Telecky, Jr.

(57) ABSTRACT

Modularized clock decoupling and signal delay management is provided for the purpose of reducing simultaneous binary signal switch-induced inductive voltage transients in lower voltage synchronous semiconductor devices. The voltage levels in low-voltage devices must be tightly maintained for proper transistor logic operations. Signal switching results in current changes on the power net of an IC. Current changes produce inductive voltage transients which propagate throughout the device and which can interfere with signal transmission and device operation. Relatively independent functioning circuits of an integrated circuit are isolated from the chip clock and each isolated circuit module is provided with its own independent, same-frequency, but slightly out-of-phase clock signal. Signal switching within any module is thus occurring out-of-phase with that of all other modules and, as a result, switch-associated voltage transients are limited to those associated with one module's circuits at a time.

13 Claims, 2 Drawing Sheets

METHOD TO REDUCE INDUCTIVE EFFECTS OF CURRENT VARIATIONS BY INTERNAL CLOCK PHASE SHIFTING

FIELD OF THE INVENTION

The present invention relates to the field of design and operation of binary signal switching in integrated circuits. More specifically, the present invention is a method to reduce inductive effects caused by a plurality of electronic gates switching simultaneously within an IC.

BACKGROUND OF THE INVENTION

Semiconductor integrated circuit (IC) devices utilize a pair of voltage levels—one higher and one lower, in the performance of their data processing operations. Toggling between the voltage levels serves as a binary signal—"1" at the higher voltage level or "0" at the lower voltage level. The signal is "read" by transistors and propagated throughout the device. In response to these voltage changes, current flows across the power net of the device flowing to and through its multitude of transistors according to the logical design of the circuit. This current flow consumes electric power.

As demand for greater capacity and performance in an ever smaller size semiconductor package has increased, so too have transistor counts and IC chip densities. In an effort to reduce power consumption, engineers have been designing transistors to function on decreasing operating voltages. This creates situations in which a large amount of current is being used at relatively low voltage (currently about 1.0V) in very tightly configured integrated circuitry. To operate properly, this lower operating voltage requires a very tight tolerance, typically within 3% of its design value.

CMOS transistors typically draw most of their current as they change state, e.g. as the binary signal changes from a 0 to a 1, or vice-versa. These state changes occur just after the rising clock edge for synchronous circuits. Synchronous circuits comprise many components of ICs. Since all synchronous IC circuits are typically coordinated by the same internal clock, all of the transistors that draw power during switching do it at the same time, resulting in large current spikes on the power net of the IC.

As anyone skilled in the art of integrated circuit design is aware, sudden changes in current within a circuit results in inductive voltage transients. These voltage transients are felt by neighboring circuits within the device. Large current spikes can produce voltage transients which are outside the operating range tolerance and can lead to false signals and operational failures.

This situation, although recognized in earlier designs of solid state devices, was not so significant. But with the development of sub-micron dimensional circuit features, inductive effects on low-power consumption, densely-packed circuits are now governing the design of new chips.

Presently this transient voltage problem is addressed by placing the power supply as close as possible to the chip and/or using sense lines on the power supply to create a tight regulation at the load. Decoupling capacitors also help to reduce the voltage transients generated between the power supply and the load. While helpful, these design techniques cannot eliminate the voltage transients caused by large current changes and have no effect on the voltage transients caused by the inductance on the IC power net from the package pins to the silicon.

Multi-chip module packaging further exacerbates this problem. Processors, including DSP and microprocessors, routinely are designed for the ability to perform a variety of tasks simultaneously utilizing a plurality of different functional modules within the chip. As multi-tasking operations progress under the influence of the synchronizing chip clock, the incidence of simultaneous signal (current) changes and their attendant voltage transients increases. The present invention reduces the simultaneity of signal switching in a majority of these circuits, lower voltage (and thus lower power) devices could be employed with greater signaling reliability.

Large ICs typically comprise relatively independent functional modules which perform their operation before passing their output on to either another module or to another part in the device. Prior art discloses that when clock signals become delayed (skewed) between data transmitters and receivers, FIFO buffers may be utilized within latch control circuits to overcome the phase uncertainty (refer to U.S. Pat. No. 6,486,721 by Greenstreet).

Prior art also discloses that where clock signals become delayed to synchronous parts, on-chip clock delay circuits can be introduced to resynchronize the clock signal to such parts (refer to U.S. Pat. No. 6,621,882 by Denny).

SUMMARY OF THE INVENTION

Modules are decoupled from each other's clock domains during information processing and subsequently re-coupled for further operational activity these isolated modules are managed on a timing scheme separate from each other without detrimental effects to the transmission of binary information. Separate clocks are generated for and coupled with these now isolated modules, such that the timing of the signal switching is managed to be out of step throughout the chip, lowering the cumulative effects of multi-module simultaneous switching and reducing unwanted interference from the associated voltage transients.

By combining decoupling/re-coupling with clock signal delay management the present invention teaches a solution for reducing chip operating voltage and power consumption without reducing signal integrity.

Therefore, to reduce the voltage transient influences associated with low level voltage signal transmission in high density ICs, and as a way to enhance the state of the art, the present invention is a method of reducing switching noise by eliminating as many simultaneous switches as possible. This is accomplished through a chip design based on decoupling of IC module clock domains and introducing same-frequency but phase-shifted clock signals to each independent domain.

To eliminate large voltage transients caused by a plurality of binary signals switching simultaneously, the present invention discloses a method of IC chip design which eliminates simultaneous signal switching wherever possible. This is accomplished by decoupling relatively independent functional units within the IC from the IC clock and generating out-of-phase clocks to each independent unit.

Large ICs typically comprise relatively independent functional modules, each processing binary information in parallel and all driven by the same chip clock. These modules may be decoupled from each other's clock domains by using input and output FIFO control circuits or any other suitable means for inter-module data transfers. The timing signal of the clock module (usually a Phase Lock Loop (PLL) circuit) of the IC can then be used to create independent clocks to each of these decoupled, isolated domains. This can be accomplished by introducing a plurality of differing clock delay circuits between the pin out of the chip PLL and the clock domains of the isolated modules. These independent clocks would thus be of the same frequency, but slightly out of phase with each other.

This will result in the timing of the signal switching of each decoupled module being non-concurrent with the signal switching from all of the other decoupled modules. Changes in switch-generated current demand will likewise be offset. At the chip level, these offset current changes will be spread out in time and will be much smaller in magnitude. The reduced current transitions will minimize the inductive voltage transients, helping to maintain signal integrity and resulting in a more reliable operation of the IC.

The proposed decoupling-by-design and clock signal management approach herein described thus provides the opportunity to create high density ICs comprising independently segregated or modularized circuits, each of which utilize slightly out-of-phase switching in their bit processing operations. This offset switching can greatly reduce large, simultaneous current changes and their resultant deleterious voltage transients. The details of the integrated circuit layout would be subject to the designer and purpose of the chip, but the nature of the concept is described hereunder.

BRIEF DESCRIPTION OF THE DRAWINGS

Exemplary embodiments of the invention are discussed hereinafter in reference to the following drawings, in which.

DETAILED DESCRIPTION OF THE INVENTION

Figure 1:
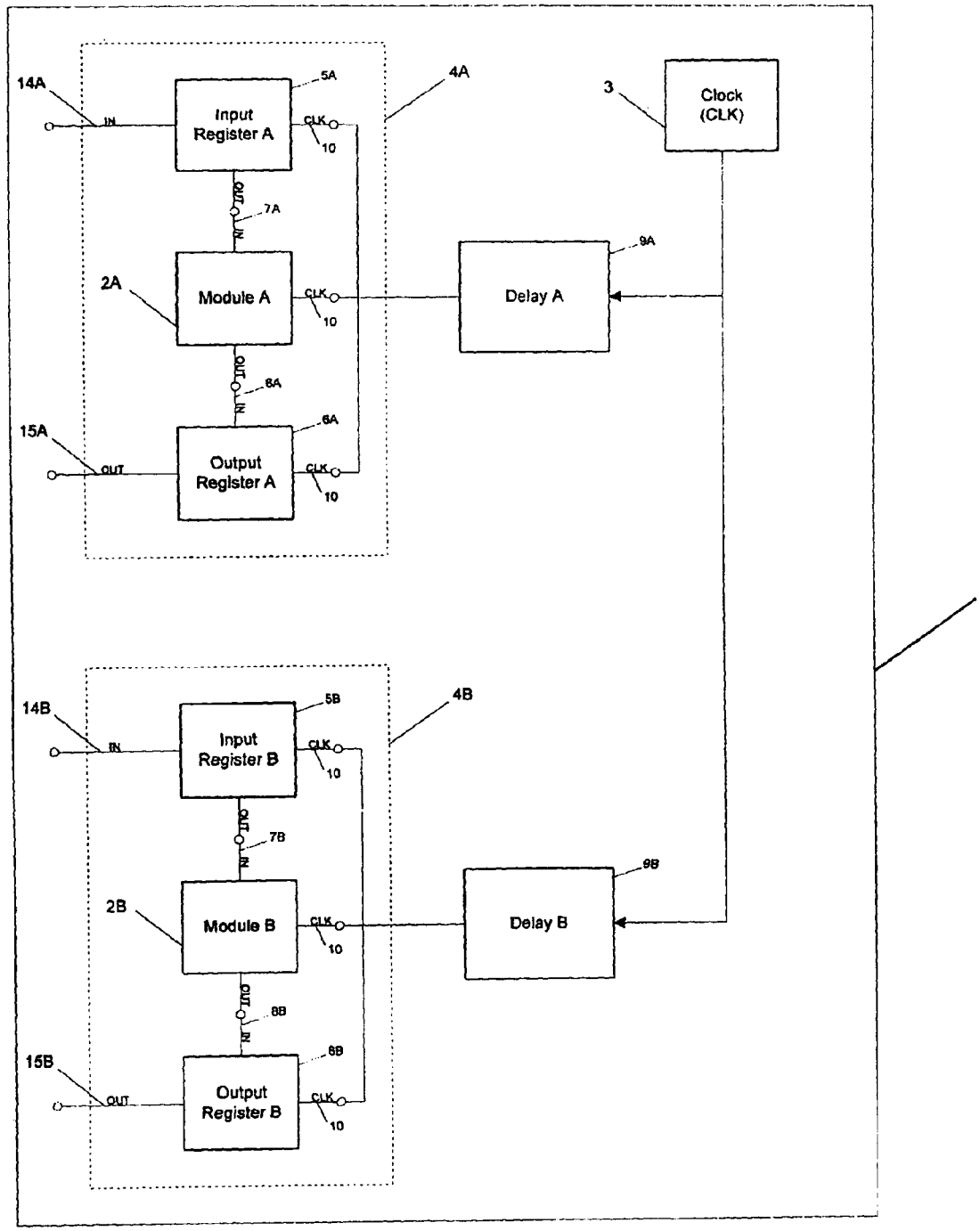
FIG. 1 is a schematic of a simplified integrated circuit comprising a pair of relatively independent functional modules (Module A and Module B) isolated from the IC clock (CLK) and a pair of clock signal delay generating circuits (Delay A and Delay B) coupled to Modules A and B.

In the preferred embodiment of the present invention, the design of an electronic integrated circuit (IC) such as a CPU microprocessor comprises reasonably independent synchronous functional modules as well as a synchronizing clock generator. The modules may include arithmetic logic units, control units or any other suitably separable units. FIG. 1 conceptually illustrates an IC chip 1 with modules A and B (2A and 2B) and on-chip clock 3. During chip design, operational boundaries 4A and 4B are identified around said modules such that binary signals may be processed internal thereto subject to a minimum of interface with the remainder of the IC.

The exemplary embodiment discloses an IC device having two independent functional modules. The method of the invention can be employed on devices comprising any number of relatively independent and separable circuits without departing from the scope of the present invention. The selection of the proper operational boundaries between modules or other functional units is a matter to be left to integrated circuit designers and is beyond the scope of this discussion. However, consideration should be given to the circuits which perform independent seperational functions within the scope of the IC, where minimal if any in-process interfacing occurs between the separable circuits.

Within the operational boundaries 4A and 4B, input FIFO (first-in/first-out) devices 5A and 5B isolate module 2A's and 2B's inputs 7A and 7B from other components of the IC. FIFO is an approach to handling program work requests from queues or stacks so that the oldest request is handled next. This may be accomplished through the use of clocked flip-flops (not shown) arranged in arrays known as registers. The clock input on each register triggers when data values are allowed to be moved into or out of a register for use by another unit. Similarly output FIFOs 6A and 6B isolate module 2A's and 2B's outputs 8A and 8B from other IC components. While clocked FIFO registers are indicated as the exemplary isolation devices, any suitable means of isolation may be used to achieve the effect.

The IC's clock 3, which may be comprised of an internal phase-locked loop (PLL), is decoupled from isolated modules 2A and 2B by the addition of clock delay circuits 9A and 9B between the IC clock and the modules. Clock delays 9A and 9B delay the phase of the signal received from the IC's clock but do not affect its frequency. The delays may consist of any type circuit or device common to those knowledgeable of the art, and one clock delay is required for each isolated module.

Figure 2:
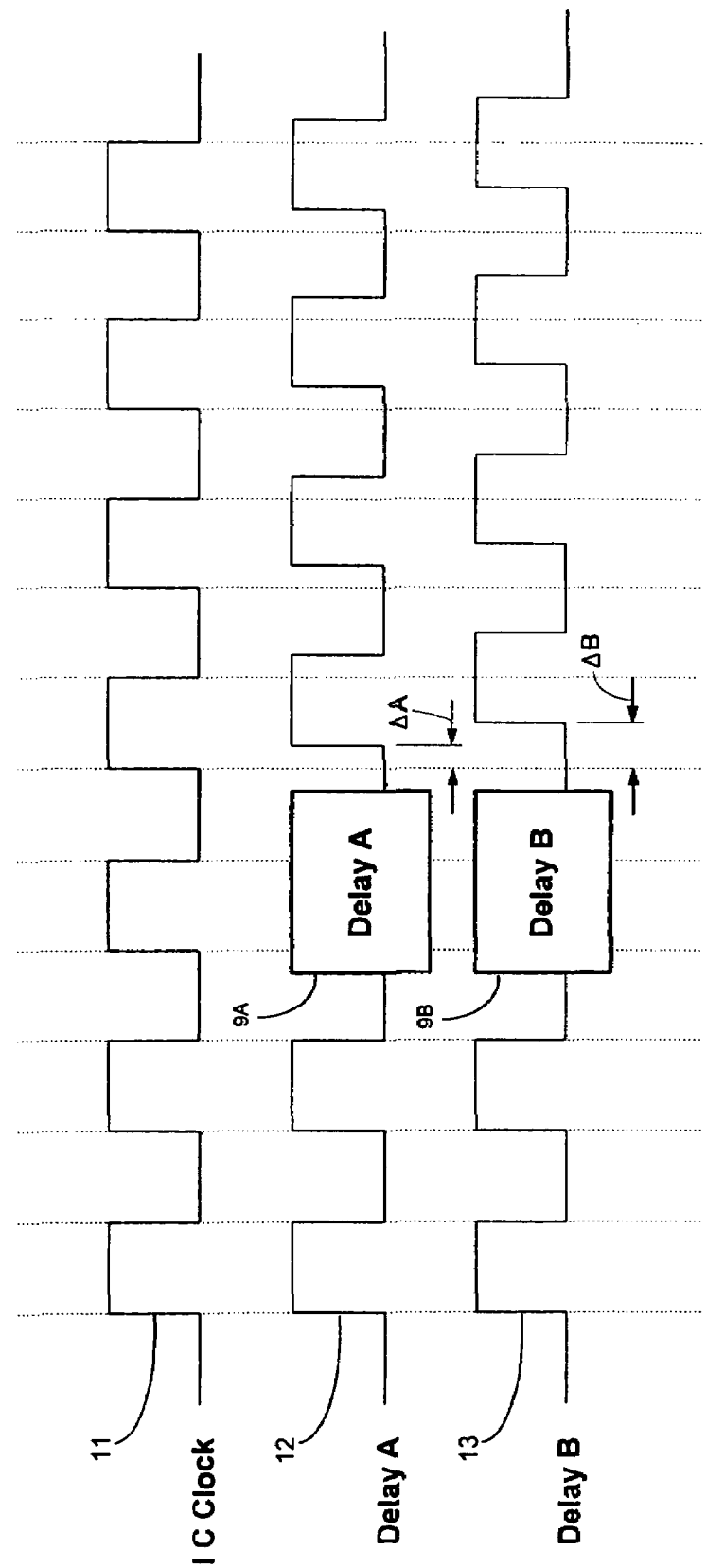
FIG. 2 timing diagram indicating a normal IC clock signal, a signal delayed by a time $\Delta A$ by delay circuit Delay A and a signal delayed by a time $\Delta B$ by delay circuit Delay B.

The clock delay circuits thus generate separate clock signals for each of the isolated domains. The clock signals are coupled to the clock input and output terminals (10) on each input and output register (5A, 6A, 5B and 6B) within each domain. The individual clock signals will all have the same frequency but each will have a slightly unique phase. FIG. 2 illustrates the signal propagation to and from the clock delays. The non-delayed IC clock 3 signal 11 is shown as a reference. Clock signal 12 is shown ahead of clock delay A (9A) in the same frequency and at the same phase as signal 11. As the clock signal 12 emerges from delay circuit 9A the signal is at the same frequency but is delayed in its phase by an amount $\Delta A$. Clock signal 13 is similarly identical to signal 11 until it emerges from delay circuit 9B with a phase delay of $\Delta B$.

Binary signal inputs are received by input registers 5A and 5B at their input terminals 14A and 14B upon receiving signals from the clock delay circuits 9A and 9B. These inputs are transferred into modules 2A and 2B upon the next respective clock signals and propagate through the modules, creating signal switching and current demand changes in accordance with each module's normal operation. However, the timing of these switching changes is now orchestrated by the module's individual clock signals 12 and 13 since each module's switching operations are based on the timing of its own clock signal. Thus the voltage switches in the module 2A and 2B are slightly out of phase with each other.

Each of the modules' processed information is transferred as output to the modules' output registers 6A and 6B for holding until it is transferred out on the modules' output wires 15A and 15B to another module or another location upon a subsequent clock signal. The output register of each module is coupled to the input register of subsequent modules, unless the input at the subsequent location may be used independent of the timing of its receipt.

Thus, decoupling modules from the IC's clock to that of their own independent, out of phase clocks creates the effect that, as switching operations proceed within all modules of the IC, the greatest number of electronic switches that can occur simultaneously is that quantity which can take place within a single module rather than within any number of the modules. This limits the cumulative number of simultaneous current changes demanded by the system at any one time. Since switch-driven current changes create induced voltages, this limited switching arrangement, in turn, reduces the magnitude of inductive effects created by such changes.

In this exemplary embodiment, a PLL is indicated to be the source input for independent clocks and delay circuits have been introduced as a method to delay transmission of the signals from said clocks; however any other means of creating same-frequency but out-of-phase clock signals to the isolated circuit segments which may be available to anyone skilled in the art can be used without departing from the teachings of the present invention.

Also, the use of FIFO registers as the method of information management into and out of the isolated modules is not intended to be a limiting factor. As discussed above relative to Greenstreet, a latch control circuit or any other available means of out of phase signal management may be employed without departing from the invention's methodology.

Because many varying and different embodiments may be made within the scope of the inventive concept herein taught, and because many modifications may be made in the embodiments herein detailed in accordance with the descriptive requirements of the law, it is to be understood that the details herein are to be interpreted as illustrative and not in a limiting sense.

The invention claimed is:

1. A method of reducing inductive voltage effects in an integrated circuit, comprising the step of:
   reducing the number of simultaneous binary signal switches within said integrated circuit,
   wherein said integrated circuit comprise a plurality of synchronous semiconductor transistor circuits arranged together on a single IC chip,
   said semiconductor transistor circuits exist in groupings of functionally separable circuit modules,
   said functionally separable circuits perform independent operational functions within the scope of the IC, isolated from the main clock of the IC, and
   each of said functionally separable circuits may be synchronously clocked by independent clock signals which may be out of phase with the IC main clock signal.

2. The method of claim 1 wherein: said integrated circuit comprise, among others, logically operational units such as digital signal processors.

3. The method of claim 1 wherein said binary signal switches comprise:
   voltage-driven transistor gate state changes which may produce a sudden change of current flow within the gate and associated circuits.

4. The method of claim 3 wherein said sudden change of current flow may produce voltage transients within the integrated circuit which may affect the proper operation of the IC.

5. A method of reducing inductive voltage effects in an integrated circuit having a number of circuits a main clock, by reducing the number of simultaneous binary signal switches, comprising the steps of:
   providing a main clock signal form said main clock;
   dividing the circuits of said integrated circuit into a plurality of circuit containing modules;
   separately clocking each of said modules by introducing a unique, independent clock signal to each module and its attendant input and output buffers;
   isolating each of said modules by the introduction of signal input and output buffers before and after said circuits;
   decoupling each module clock signal from the said main clock signal;
   coupling the main clock signal to each unique, independent clock signal in a phase offset manner; and
   re-interfacing said isolated and buffered modules to the remainder of the operational units of the device.

6. The method of claim 5, further including the step of:
   providing clocked FIFO registers and latch control circuits for said input and output buffers may comprise for independent timing of buffer signal transmission.

7. The method of claim 5 wherein said step of separately clocking each of said modules includes:
   connecting an output from said main clock carrying said main clock signal to a delay mechanism within each module, designed to produce a module clock signal of the same frequency as the main clock, but uniquely out of phase with said main clock signal; and
   connecting said delay mechanism output to the clock input terminal of said module input and output buffers.

8. The method of claim 5 wherein results of said method comprise:
   an integrated circuit wherein each functionally independent module is isolated from said main clock by a clock delay circuit such that the timing of the logical binary switches of any module are out of phase from the timing of the switches of all other modules; and
   a limit on the maximum number of simultaneous switches occurring within the integrated circuit to the number contained in any individual isolated module; and
   a limit on the maximum strength and interference potential of switching-induced voltage transients to that comprised by the limit on the number of simultaneous switches occurring within any one module; and
   the ability to design and operate an integrated circuit on reduced voltages, utilizing less power, but with greater reliability.

9. An integrated circuit chip having reduced inductive voltage effects, comprising:
   a main portion of said chip;
   a main clock, for providing a main clock signal;
   a plurality of modules having inputs and outputs connecting said modules to said main portion of said chip, functional circuits and signal input buffers between said module inputs and said modules and output buffers between said functional module circuits and said module outputs for decoupling said functional circuits from the said main clock signal;
   an independent clock signal, offset in phase and concurrent in frequency, from said main clock signal, associated with each module and its attendant input and output buffers.

10. The circuit of claim 9 wherein:
    said input and output buffers may comprise clocked FIFO registers.

11. The circuit of claim 9 wherein:
    said input and output buffers may comprise latch control circuits.

12. The circuit of claim 9 wherein each of independent module clock signals is generated by a unique independent clock circuit comprising:
    an input terminal connected to receive said main clock signal;
    a delay mechanism designed to produce a clock signal of the same frequency as said main clock signal, and out of phase with said main clock signal and unique from and out of phase with at least one other module clock signal; and
    an output terminal for providing said unique module clock signal to said functional circuits of said module.

13. The circuit of claim 9 wherein said results of said circuit comprise:

an integrated circuit wherein each functionally independent module is isolated from said main IC clock by a clock delay circuit such that the timing of the logical binary switches of any module are out of phase from the timing of the switches of the majority of other modules; and a limit on the maximum number of simultaneous switches occurring within the integrated circuit to the number contained in any individual isolated module; and a limit on the maximum strength and interference potential of switching-induced voltage transients to that comprised by the limit on the number of simultaneous switches occurring within any one module; and the ability to design and operate an integrated circuit on reduced voltages, utilizing less power, but with greater reliability.

\* \* \* \* \*